United States Patent
Byeon et al.

(10) Patent No.: US 8,923,067 B2
(45) Date of Patent: Dec. 30, 2014

(54) MEMORY SYSTEM AND METHOD OF OPERATING MEMORY SYSTEM USING SOFT READ VOLTAGES

(71) Applicants: Dae-seok Byeon, Seongnam-si (KR); Bo-geun Kim, Suwon-si (KR); Jae-woo Park, Suwon-si (KR)

(72) Inventors: Dae-seok Byeon, Seongnam-si (KR); Bo-geun Kim, Suwon-si (KR); Jae-woo Park, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 14/050,430

(22) Filed: Oct. 10, 2013

(65) Prior Publication Data

US 2014/0153338 A1    Jun. 5, 2014

(51) Int. Cl.
    *G11C 16/28*    (2006.01)
    *G11C 16/04*    (2006.01)
    *G11C 16/26*    (2006.01)
    *G11C 16/34*    (2006.01)

(52) U.S. Cl.
    CPC ........... *G11C 16/0483* (2013.01); *G11C 16/28* (2013.01); *G11C 16/26* (2013.01); *G11C 16/3404* (2013.01); *G11C 16/3422* (2013.01)
    USPC ............ 365/185.21; 365/185.02; 365/185.09; 365/185.18

(58) Field of Classification Search
    CPC ........... G11C 11/5642; G11C 16/0483; G11C 16/26; G11C 16/28; G11C 16/34; G11C 16/3404; G11C 16/3418; G11C 16/3422; G11C 16/3431
    USPC ............ 365/185.21, 185.02, 185.09, 185.18, 365/200, 207
    See application file for complete search history.

(56) References Cited

U.S. PATENT DOCUMENTS

| | | | |
|---|---|---|---|
| 7,800,943 B2 | 9/2010 | Ravasio et al. | |
| 7,814,401 B2 | 10/2010 | Alrod et al. | |
| 7,911,848 B2 | 3/2011 | Eun et al. | |
| 8,099,652 B1 | 1/2012 | Alrod et al. | |
| 8,576,622 B2 * | 11/2013 | Yoon et al. | 365/185.03 |
| 8,582,360 B2 * | 11/2013 | Park et al. | 365/185.09 |
| 2011/0038212 A1 | 2/2011 | Uchikawa et al. | |
| 2011/0197015 A1 | 8/2011 | Chae et al. | |
| 2011/0235415 A1 | 9/2011 | Park et al. | |
| 2013/0229867 A1 * | 9/2013 | Tang et al. | 365/185.2 |
| 2014/0104943 A1 * | 4/2014 | Chen et al. | 365/185.03 |

FOREIGN PATENT DOCUMENTS

KR    2011-0092091 A    8/2011

* cited by examiner

*Primary Examiner* — Tan T. Nguyen
(74) *Attorney, Agent, or Firm* — Volentine & Whitt, PLLC

(57) ABSTRACT

A method is provided for operating a memory system. The method includes reading nonvolatile memory cells using a first soft read voltage, a voltage level difference between the first soft read voltage and a first hard read voltage being indicated by a first voltage value; and reading the nonvolatile memory cells using a second soft read voltage paired with the first soft read voltage, a voltage level difference between the second soft read voltage and the first hard read voltage being indicated by a second voltage value. The second voltage value is different than the first voltage value. Also, a difference between the first voltage value and the second voltage value corresponds to the degree of asymmetry of adjacent threshold voltage distributions among multiple threshold voltage distributions set for the nonvolatile memory cells of the memory system.

20 Claims, 17 Drawing Sheets

TABLE

| #P/E cycle | ΔV1 | ΔV2 |
|---|---|---|
| < 1k | VAL1 | VAL2 |
| > 1k, < 2K | VAL3 | VAL4 |
| ⋮ | ⋮ | ⋮ |

MEMORY SYSTEM AND METHOD OF OPERATING MEMORY SYSTEM USING SOFT READ VOLTAGES

CROSS-REFERENCE TO RELATED APPLICATIONS

A claim for priority under 35 U.S.C. §119 is made to Korean Patent Application No. 10-2012-0140512, filed on Dec. 5, 2012, in the Korean Intellectual Property Office, the entire contents of which are hereby incorporated by reference.

BACKGROUND

The inventive concept relates to a memory device and memory system, and a method of operating the memory device and memory system, and more particularly, to a memory device and memory system that improve operational reliability and operating speed, and a method of operating the same.

As the amount of data that needs to be processed in a memory device or a memory system increases, operational reliability and operating speed for data processing must be improved.

SUMMARY

Embodiments of the inventive concept provide a memory device and memory system with improved reliability or operating speed, and a method of operating the memory device or memory system.

According to an aspect of the inventive concept, a method is provided for operating a memory system. The method includes reading nonvolatile memory cells using a first soft read voltage, a voltage level difference between the first soft read voltage and a first hard read voltage being indicated by a first voltage value; and reading the nonvolatile memory cells using a second soft read voltage paired with the first soft read voltage, a voltage level difference between the second soft read voltage and the first hard read voltage being indicated by a second voltage value. The second voltage value is different than the first voltage value. Also, a difference between the first voltage value and the second voltage value corresponds to the degree of asymmetry of adjacent threshold voltage distributions among multiple threshold voltage distributions set for the nonvolatile memory cells of the memory system.

According to another aspect of the inventive concept, a method is provided for operating a memory system. The method includes applying multiple hard read voltages to a word line; sequentially applying at least one pair of soft read voltages corresponding to each hard read voltage among the multiple hard read voltages to the word line; and correcting a readout error of data programmed in nonvolatile memory cells connected to the word line on the basis of reliable data, the reliable data being read from the nonvolatile memory cells using each of the hard read voltages and the corresponding at least one pair of soft read voltages. Each pair of the at least one pair of soft read voltages has differently set voltage differences from the corresponding hard read voltage on the basis of a degree of asymmetry of adjacent threshold voltage distributions having different bit values of hard data identified by the corresponding hard read voltage. The differences from the corresponding hard read voltage for each pair of the at least one pair of soft read voltages correspond to results of counting the number of arbitrary bit values read using a voltage level in a threshold voltage distribution corresponding to an erase state or a threshold voltage distribution having the highest voltage level.

According to another aspect of the inventive concept, a memory system includes a flash memory including a plurality of memory cells arranged in a plurality of word lines, and a memory controller for controlling a read operation of the flash memory. The memory controller is configured to provide a normal read command to the flash memory to read normal read data from the plurality of non-volatile memory cells, and to provide a soft decision command to the flash memory when an error is detected in the normal read data. The flash memory is configured to apply a first hard read voltage, a first soft read voltage, and a second soft read voltage paired with the first soft read voltage to a selected word line in response to the soft decision command to read corresponding memory cells. A voltage level difference between the first soft read voltage and the first hard read voltage is indicated by a first voltage value and a voltage level difference between the second soft read voltage and the first hard read voltage is indicated by a second voltage value, where the second voltage value is different from the first voltage value.

BRIEF DESCRIPTION OF THE DRAWINGS

Exemplary embodiments of the inventive concept will be more clearly understood from the following description taken in conjunction with the accompanying drawings, in which.

DETAILED DESCRIPTION OF THE EMBODIMENTS

Figure 1:
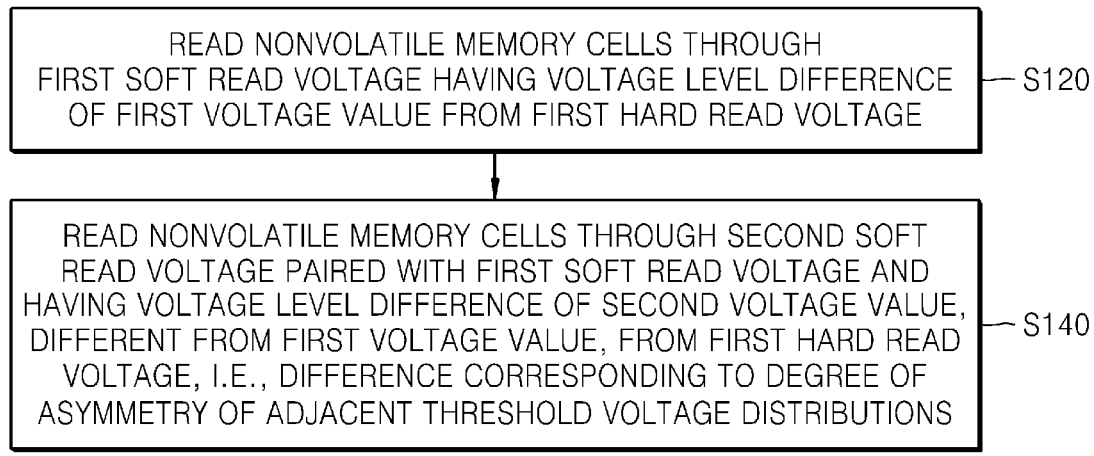
FIG. 1 is a flowchart illustrating a method of operating a memory system, according to an embodiment of the inventive concept.

Embodiments will be described in detail with reference to the following detailed description and accompanying drawings. The inventive concept, however, may be embodied in various different forms, and should not be construed as being limited only to the illustrated embodiments. Rather, these embodiments are provided so that this disclosure will be thorough and complete, and will fully convey the inventive concept to one of ordinary skill in the art. Accordingly, known processes, elements, and techniques may not be described with respect to some of the embodiments. Unless otherwise noted, like reference numerals denote like elements throughout the attached drawings and written description, and thus descriptions will not be repeated. In the drawings, the dimensions of layers and regions may be exaggerated for clarity.

Terms used in this specification are used for describe specific embodiments, and are not intended to limit the scope of the present embodiments. A singular form used for the terms herein may include a plural form unless being clearly different from the context. In this specification, the meaning of "include", "comprise", "including", or "comprising" specifies a property, a region, a fixed number, a step, a process, an element and/or a component, for example, but does not exclude other properties, regions, fixed numbers, steps, processes, elements and/or components.

Unless otherwise defined, all terms used herein include technical terms and scientific terms, which have the same meanings that those of ordinary skill in the art commonly understand. Additionally, it should be understood that typically used terms defined in dictionaries have consistent meanings in related technical contents, and if not explicitly defined, should not be interpreted as being excessive formal meanings.

Figure 2:
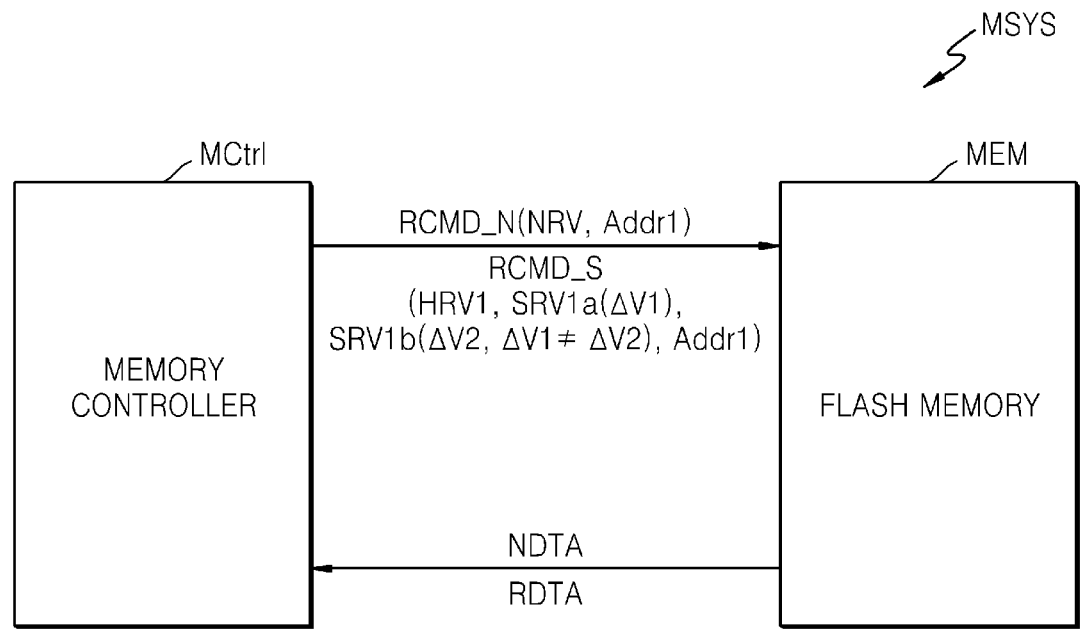
FIG. 2 is a view of a memory system operating according to the method of FIG. 1, according to an embodiment of the inventive concept.

FIG. 1 is a flowchart illustrating a method of operating a memory system, according to an embodiment of the inventive concept. FIG. 2 is a block diagram illustrating a memory system MSYS configured to perform the method of FIG. 1, according to an embodiment of the inventive concept.

Referring to FIGS. 1 and 2, the method of operating the memory system MSYS, according to an embodiment, includes reading nonvolatile memory cells in operation S120 using a first soft read voltage SRV1*a*. A voltage level difference between the first soft read voltage SRV1*a* and a first hard read voltage HRV1 is indicated by a first voltage value ΔV1. The method further includes reading nonvolatile memory cells in operation S140 using a second soft read voltage SRV1*b* paired with the first soft read voltage SRV1*a*. A voltage level difference between the second soft read voltage SRV1*b* and the first hard read voltage HRV1 is indicated by a second voltage value ΔV2. The second voltage value ΔV2 may be different from the first voltage value ΔV1, where the difference between the second voltage value ΔV2 and the first voltage value ΔV1 corresponds to an asymmetry between adjacent threshold voltage distributions among multiple threshold voltage distributions set for the memory system MSYS.

Figure 15:
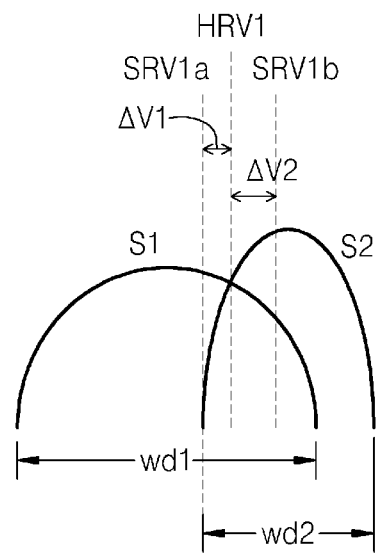
FIG. 15 is a view illustrating a soft decision operation, according to an embodiment of the inventive concept.
Figures 18, 19:
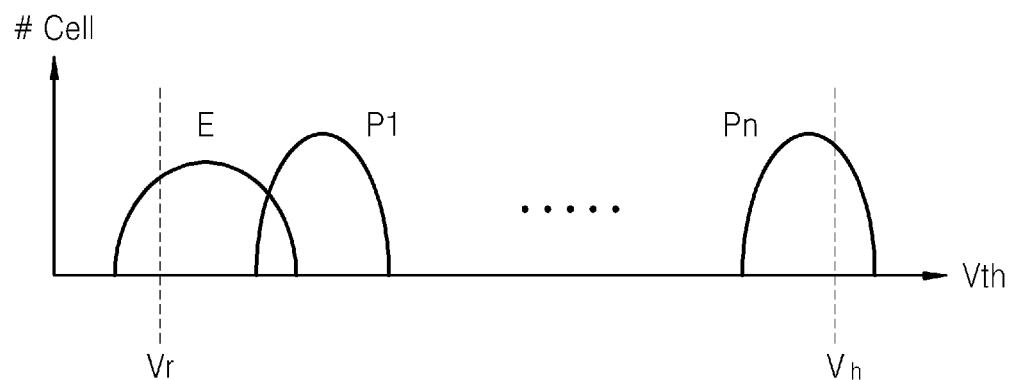
FIG. 18 is a view illustrating an operation of detecting a change in threshold voltage distribution and setting a soft decision voltage corresponding thereto, according to an embodiment of the inventive concept.
FIG. 19 is a table illustrating an operation of detecting a change in threshold voltage distribution and setting a soft decision voltage corresponding thereto, according to an embodiment of the inventive concept.

The asymmetry in the adjacent threshold voltage distributions may include the case in which voltage ranges (wd1, wd2) of the adjacent threshold voltage distributions are different from one another (wd1≠wd2), as shown in FIG. 15, described below. Also, as shown in FIG. 18, described below, the asymmetry may be determined by counting the number of specific bit values in a readout result when the asymmetry is read out using a voltage in a voltage range of an arbitrary threshold voltage distribution. As suggested in FIG. 19, described below, the asymmetry may result from durability change, caused by repetition of program and erase (P/E) operations, or P/E cycles, for example.

Threshold voltage distributions set in the memory system MSYS are distinguished as different data. Differences between the first voltage value ΔV1 and the second voltage value ΔV2 and the corresponding threshold voltage distributions will be described in more detail.

The memory system MSYS according to the depicted embodiment includes a memory controller MCtrl and a flash memory MEM. The memory controller MCtrl controls writing and reading data to and from the flash memory MEM in response to a request from a host (not shown). For example, the memory controller MCtrl may apply a normal read command RCMD_N to the flash memory MEM in response to a request from the host. The normal read command RCMD_N may include information regarding a voltage level of the normal read voltage NRV and a first address Addr1 of nonvolatile memory cells to be read. However, the normal read voltage NRV and the first address Add1 may be provided to the flash memory MEM as a control signal (not shown) that is applied separately from the normal read command RCMD_N. The normal read command RCMD_N and the normal read voltage NRV may be set on the assumption that there is no error in nonvolatile memory cells of the flash memory MEM to be read or that errors are correctable using a general ECC operation, unlike a soft decision command RCMD_S and voltages HRV1, SRV1*a*, and SRV1*b* according thereto. A specific example of the normal read voltage NRV will be described below.

The flash memory MEM outputs normal read data NDTA in response to the normal read command RCMD_N. For example, the flash memory MEM may output as the normal read data NDTA data of the nonvolatile memory cells read out by applying the normal read voltage NRV to a word line corresponding to the first address Addr1. The normal read voltage NRV may be included in the normal read command RCMD_N and provided by an additional control signal, However, if there is an error in the normal read data NDTA and the error is not corrected, the memory controller MCtrl may transmit the soft decision command RCMD_S to the flash memory MEM. The flash memory MEM sequentially applies a first hard read voltage HRV1, a first soft read voltage SRV1a, and a second soft read voltage SRV1b to the word line corresponding to the first address Addr1 in response to the soft decision command RCMD_S, thereby generating reliable data RDTA. The generation of the reliable RDTA will be described below in more detail.

The first soft read voltage SRV1a and the second soft read voltage SRV1b, which are paired with the first hard read voltage HRV1, have voltage level differences of first voltage value $\Delta V1$ and second voltage value $\Delta V2$ from the first hard read voltage HRV1, respectively. For example, the first soft read voltage SRV1a may have a lower voltage level than the first hard read voltage HRV1 by the first voltage value $\Delta V1$, and the second soft read voltage SRV1b may have a higher voltage level than the first hard read voltage HRV1 by the second voltage value $\Delta V2$. As mentioned above, in relation to the memory system MSYS and the method of operating the same, according to an embodiment, the first voltage value $\Delta V1$ may be different from the second voltage value $\Delta V2$ ($\Delta V1 \neq \Delta V2$).

FIG. 2 shows when the memory controller MCtrl transmits to the flash memory MEM in the memory system MSYS information regarding the first soft read voltage SRV1a and the second soft read voltage SRV1b, which have differences of first and second voltage values $\Delta V1$ and $\Delta V2$ from the first hard read voltage HRV1, respectively. However, embodiments of the inventive concept are not limited thereto.

Figure 3:
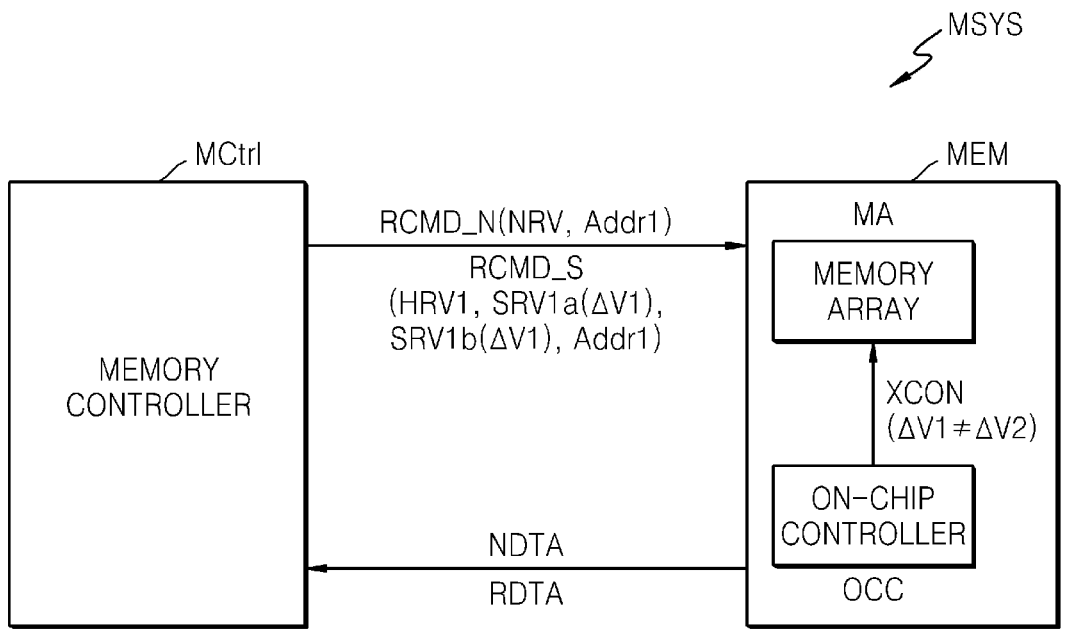
FIG. 3 is a view of a memory system according to an embodiment of the inventive concept.
Figure 4:
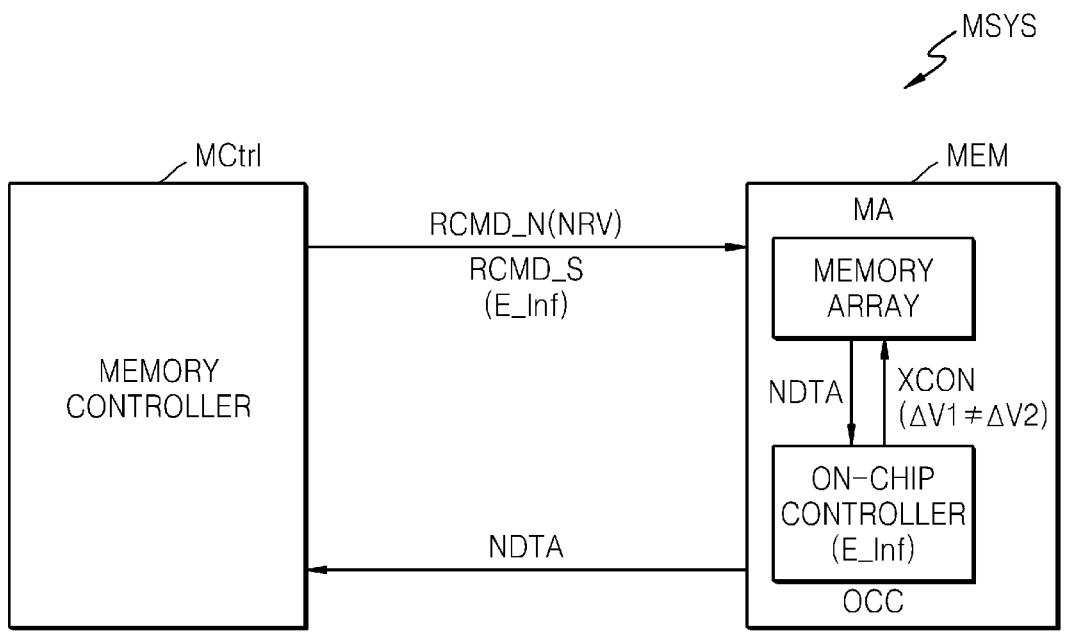
FIG. 4 is a view of a memory system according to an embodiment of the inventive concept.

FIGS. 3 and 4 are block diagrams illustrating memory systems, according to embodiments of the inventive concept.

Referring to FIG. 3, a flash memory MEM of the memory system MSYS includes a memory array MA and an on-chip controller OCC. The on-chip controller OCC receives information regarding the first soft read voltage SRV1a and the second soft read voltage SRV1b, which initially have the same difference (indicated by first voltage value $\Delta V1$) from the first hard read voltage HRV1. The on-chip controller OCC then adjusts the voltage levels of the first soft read voltage SRV1a and the second soft read voltage SRV1b, so that the first voltage value $\Delta V2$ is not equal to the first voltage value $\Delta V1$. That is, the first soft read voltage SRV1a and the second soft read voltage SRV1b may be set to have different respective voltage level differences of the first and second voltage values $\Delta V1$ and $\Delta V2$ from the first hard read voltage HRV1.

The on-chip controller OCC generates a control signal XCON to apply to the first address Addr1, the first hard read voltage HRV1, and the first soft read voltage SRV1a and the second soft read voltage SRV1b having respective first and second voltage values $\Delta V1$ and $\Delta V2$ in response to the soft decision command RCMD_S of the memory controller MCtrl. Although FIG. 3 shows the control signal XCOM being directly applied from the on-chip controller OCC to the memory array MA, this is for convenience of illustration. The flash memory MEM according to an embodiment may further include control logic (not shown), a voltage generating unit (not shown), and a decoder (not shown) in order to apply a read voltage to a word line of the memory array MA in response to the control signal XCON.

Referring to FIG. 4, like FIG. 3, a flash memory MEM of the memory system MSYS according to another embodiment of the inventive concept includes a memory array MA and an on-chip controller OCC. However, if there is an uncorrectable error in the normal read data NDTA in response to the normal read command RCMD_N, the on-chip controller OCC of the flash memory MEM of FIG. 4 performs a soft decision operation autonomously. For example, the on-chip controller OCC may perform a soft decision operation on the basis of error information E_inf regarding the normal read data NDTA corresponding to the normal read command RCMD_N. The error information E_inf may be received when the normal read data NDTA is transmitted to the memory controller MCtrl or may be obtained when the on-chip controller OCC directly searches for an error in the normal read data NDTA.

Although the normal read data NDTA and the reliable data RDTA directly transmitted from the memory array MA to the on-chip controller OCC are shown in FIG. 4, this is for convenience of illustration. The flash memory MEM according to an embodiment may further include a page buffer (not shown) and a data input/output unit (not shown) in order to read the normal read data NDTA and the reliable data RDTA from the memory array MA.

As described above, the control of the soft decision operation according to embodiments of the inventive concept may be performed in a memory controller or an on-chip controller. However, hereinafter, for convenience of description, the description is made on the basis of the memory system MSYS of FIG. 2, unless otherwise indicated.

Figure 5:
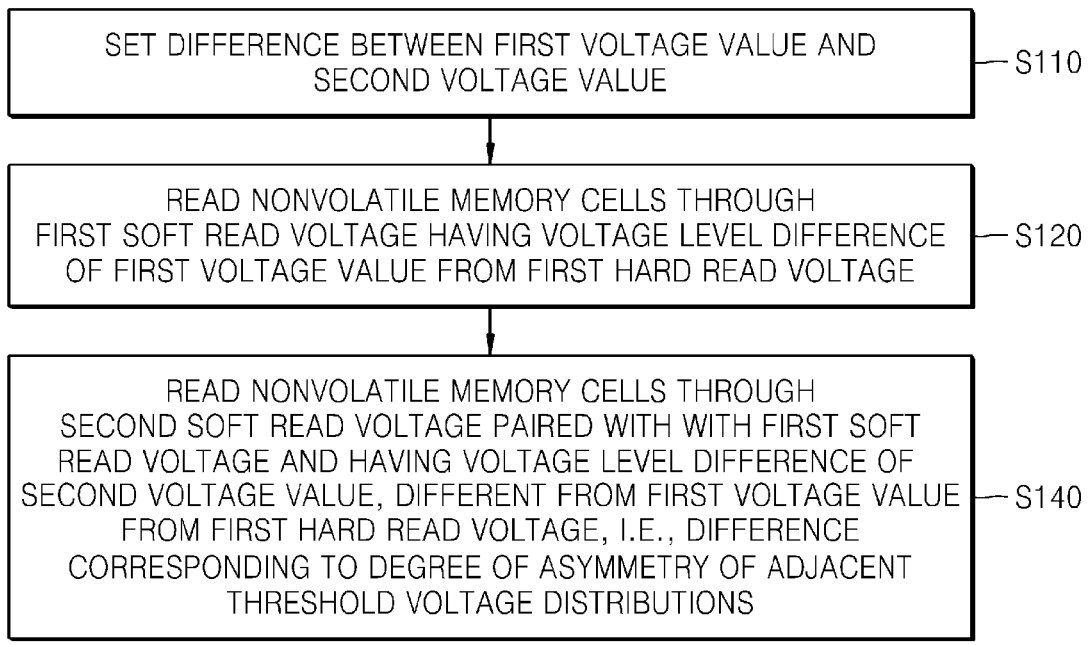
FIG. 5 is a flowchart illustrating a method of operating a memory system, according to another embodiment of the inventive concept.

FIG. 5 is a flowchart illustrating a method of operating a memory system, according to another embodiment of the inventive concept.

Referring to FIGS. 2 and 5, the method of operating a memory system, according to another embodiment, further includes operation S110 for setting a difference between the first voltage value $\Delta V1$ and the second voltage value $\Delta V2$ before performing the operation method of FIG. 1. The method of FIG. 1 includes reading nonvolatile memory cells in operation S120 using a first soft read voltage SRV1a having a voltage level difference from first hard read voltage HRV1 indicated by the first voltage value $\Delta V1$, and reading nonvolatile memory cells in operation S140 using a second soft read voltage SRV1b having a voltage level difference from the first hard read voltage HRV1 indicated by the second voltage value $\Delta V2$. As mentioned above, the difference between the first voltage value $\Delta V1$ and the second voltage value $\Delta V2$ corresponds to an asymmetry between adjacent threshold voltage distributions among threshold voltage distributions set for the memory system MSYS. Before additional description, structure and operation of the flash memory MEM according to an embodiment of the inventive concept will be described.

Figure 6:
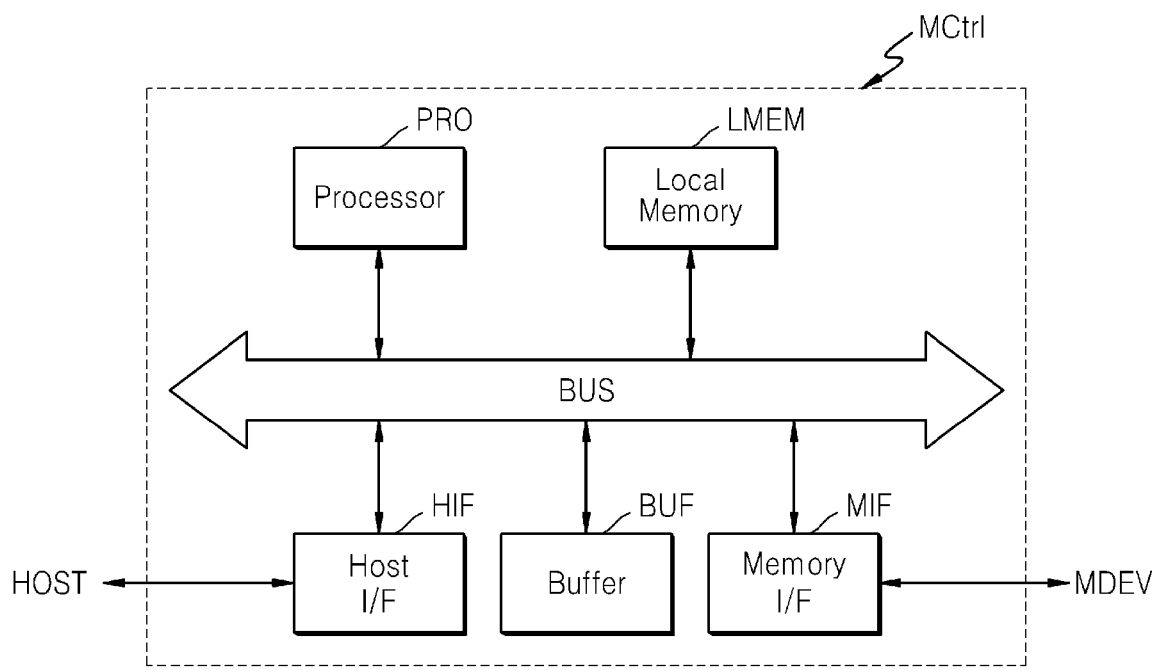
FIG. 6 is a view illustrating a memory controller, according to an embodiment of the inventive concept.

FIG. 6 is a block diagram illustrating a memory controller MCtrl, according to an embodiment of the inventive concept.

Referring to FIG. 6, in relation to the memory controller MCtrl, a host interface HIF, a memory interface MIF, a local memory LMEM, a buffer BUF, and a processor PRO are connected to each other via a bus BUS.

The host interface HIF provides an interface with an external host device HOST. For example, the host interface HIF may provide an interface of a Serial Advanced Technology Attachment (SATA) or Serial Attached SCSI (SAS) protocol. However, the inventive concept is not limited thereto. For example, other than the SATA or SAS protocol, the host interface HIF may provide an interface with a host device HOST using various interface protocols, such as Universal Serial Bus (USB), Man Machine Communication (MMC), Peripheral Component Interconnect-Express (PCI-E), Parallel Advanced Technology Attachment (PATA), Small Computer System Interface (SCSI), Enhanced Small Device Interface (ESDI), and Intelligent Drive Electronics (IDE).

The memory interface MIF provides an interface with a memory device MDEV in order to program to or read data from the memory device MEDV in response to a request from the host device HOST. For example, the memory interface MIF may provide to the memory device MDEV the result obtained by converting a logical block address transmitted from the host device HOST into a physical address for a page of the memory device MDEV.

The buffer BUF is used for seamless data transfer between the host device HOST and the memory device MDEV. For example, the buffer BUF may temporarily store data to be programmed in the memory device MDEV in response to a request of the host device HOST. Or, the buffer BUF may temporarily store data to be read from the memory device MDEV in response to a request of the host device HOST. The buffer BUF may be implemented by various types of volatile memories, such as Dynamic Random Access Memory (DRAM) or static Random Access Memory (SRAM), or various types of nonvolatile memories, such as Magnetroresistive Random Access Memory (MRAM), Phase-Change Random Access Memory (PRAM), Ferroelectric Random Access Memory (FRAM), or flash memory.

The local memory LMEM may load data, a control module, or a control program necessary for the memory controller MCtrl to process a request of the host device HOST in the memory device MDEV. For example, firmware may be stored in the local memory LMEM. The firmware may include software, which provides commands and data for driving the memory system MSYS and is stored in on a computer readable medium and/or specific storage means for hardware. In order to perform a request of a host device by the memory system MSYS, the firmware performs at least one of machine language processing, data transfer, list processing, floating-point arithmetic, and channel control. The firmware may control setting the normal read command RCMD_N, the soft decision command RCMD_S, and the read voltage levels corresponding thereto.

In addition, the local memory LMEM may store or load a mapping table referenced by an operating system and address mapping. Like the buffer BUF, the local memory LMEM may be implemented by volatile memories, such as DRAM or SRAM, or nonvolatile memories, such as MRAM, PRAM, FRAM, or flash memory, for example. However, local memory for firmware may be implemented with nonvolatile memory. The local memory LMEM may be implemented with at least one homogeneous or heterogeneous memory.

The processor PRO controls operation of each component of the memory controller MCtrl, and also interprets and executes control modules and/or control programs stored or loaded in the local memory LMEM, so as to process requests from the host device HOST.

Figure 7:
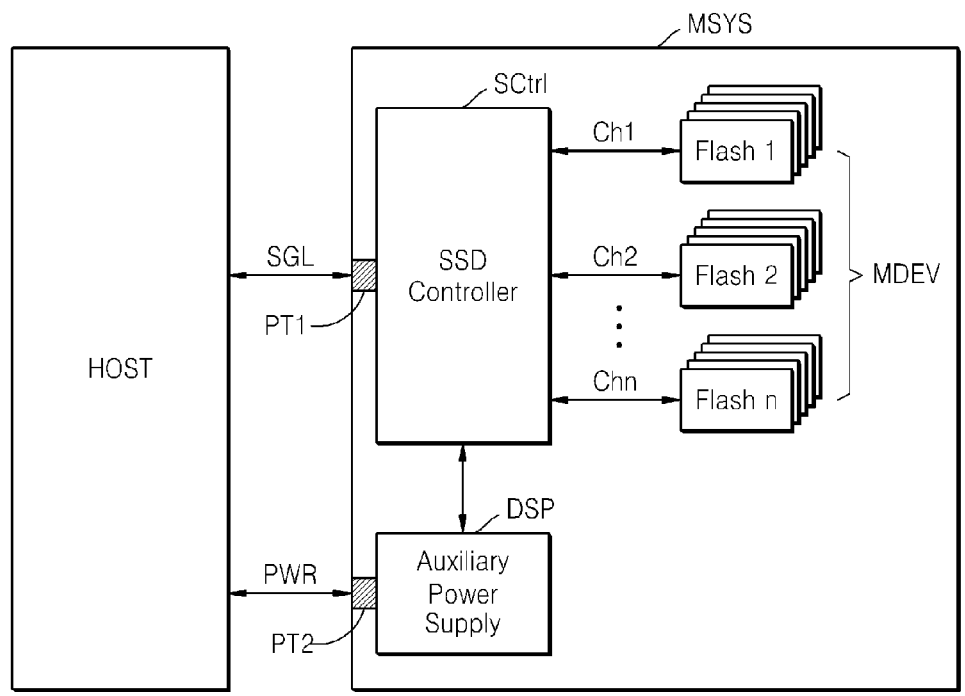
FIG. 7 is a block diagram of a memory system is applied to a Solid State Drive (SSD), according to an embodiment of the inventive concept.

When the memory system MSYS according to an embodiment includes a Solid State Drive (SSD) or is included in an SSD, the memory controller MCtrl of FIG. 6 may be included in an SSD controller SCtrl, an example of which is shown in FIG. 7.

FIG. 7 is a block diagram of a memory system applied to an SSD, according to an embodiment of the inventive concept.

Referring FIG. 7, the SSD MSYS includes an SSD controller SCtrl and a memory device MDEV. The SSD controller SCtrl controls the memory device MDEV in response to a signal SGL received from a host device HOST using a first port PT1 of the SSD MSYS. The SSD controller SCtrl is connected to the memory device MDEV using multiple channels Ch1 to Chn. The memory device MDEV may include multiple flash memories. The flash memories may be the flash memories MEM according to the above-mentioned embodiments. However, the flash memories are not limited thereto, and thus may include other types of flash memories or other types of nonvolatile memories. Each of the channels Ch1 to Chn may be connected to multiple flash memories, as shown, or to one flash memory.

The SSD MSYS further includes an auxiliary power supply DSP, and may receive power PWR from the host device HOST through a second port PT2. However, the SSD MSYS is not limited thereto, and thus may receive power from an external device, other than the host device HOST.

The SSD MSYS may output the result as a signal SGL, obtained by processing a request of the host device HOST, through the first port PT1. The signal SGL output from the SSD MSYS may be a main response MRSP, for example.

Control of a request from the host device HOST in the memory controller MCtrl or the SSD controller SCtrl may be performed by data and commands set by firmware. When the memory system MSYS includes the SSD MSYS as shown in FIG. 7, firmware may be as shown in FIG. 8.

Figure 8:
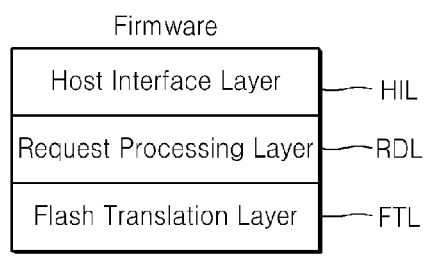
FIG. 8 is a conceptual view of firmware in a memory controller, according to an embodiment of the inventive concept.

FIG. 8 is a conceptual view of firmware in a memory controller, according to an embodiment of the inventive concept.

Referring to FIG. 8, the firmware includes a host interface layer HIL and a flash translation layer FTL. The host interface layer HIL processes a request received from the host device HOST. For example, the host interface layer HIL may include functions for machine language processing and data transfer in response to the signal SGL providing a request from the host device HOST of FIG. 7.

The flash translation layer FTL performs control and/or resource allocation to map a received address from the host device HOST into a physical address of the memory device MDEV, according to the result processed in the host interface layer HIL. The buffer BUF of FIG. 6 may perform buffering of data required for the mapping operation, and the local memory LMEM of FIG. 6 may store a mapping table required for the mapping operation.

The example of firmware illustrated in FIG. 8 further includes a request processing layer RDL. The request processing layer RDL of FIG. 8 may be controlled using the method of operating a memory system of FIG. 1, according to an embodiment of the inventive concept. For example, the request processing layer RDL of the firmware may apply the normal read command RCMD_N and the soft decision command RCMD_S corresponding to the request signal SIG of the host device HOST of FIG. 7 to the flash memory MEM, and then may output the corresponding result (for example, the normal read data NDTA) in response to the request signal SIG of the host device HOST.

Although the request processing layer RDL is separate from the host interface layer HIL as shown in FIG. 8, this is just for convenience of description. Alternatively, the request processing layer RDL may be included in the host interface layer HIL, for example.

Figure 9:
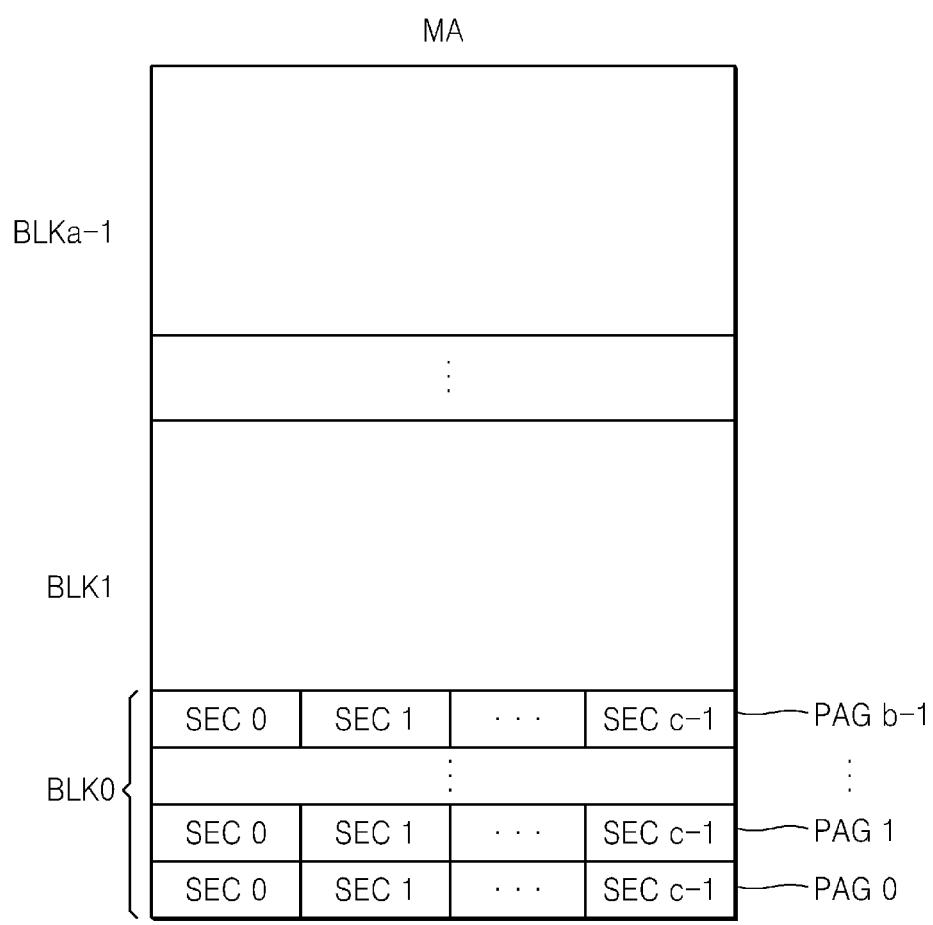
FIG. 9 is a view illustrating a structure of a memory cell array in a flash memory, according to an embodiment of the inventive concept.

FIG. 9 is a conceptual view illustrating a structure of a memory cell array in a flash memory, according to an embodiment of the inventive concept.

Referring to FIGS. 5 and 9, the flash memory MEM of the memory system MSYS includes a memory cell array MA. The memory cell array MA includes a (a is an integer greater than or equal to 2) blocks BLK0 to BLKa-1. Each of the blocks BLK0 to BLKa-1 includes b (b is an integer greater than or equal to 2) pages PAG0 to PAGb-1. Each of the pages PAG0 to PAGb-1 includes c (c is an integer greater than or equal to 2) sectors SEC0 to SECc-1. Although only representative pages PAG0 to PAGb-1 and sectors SEC0 to SECc-1 in representative block BLK0 are shown in FIG. 9 for convenience of illustration, it is understood that the other blocks BLK1 to BLKa-1 have the same structure as the block BLK0.

Figure 10:
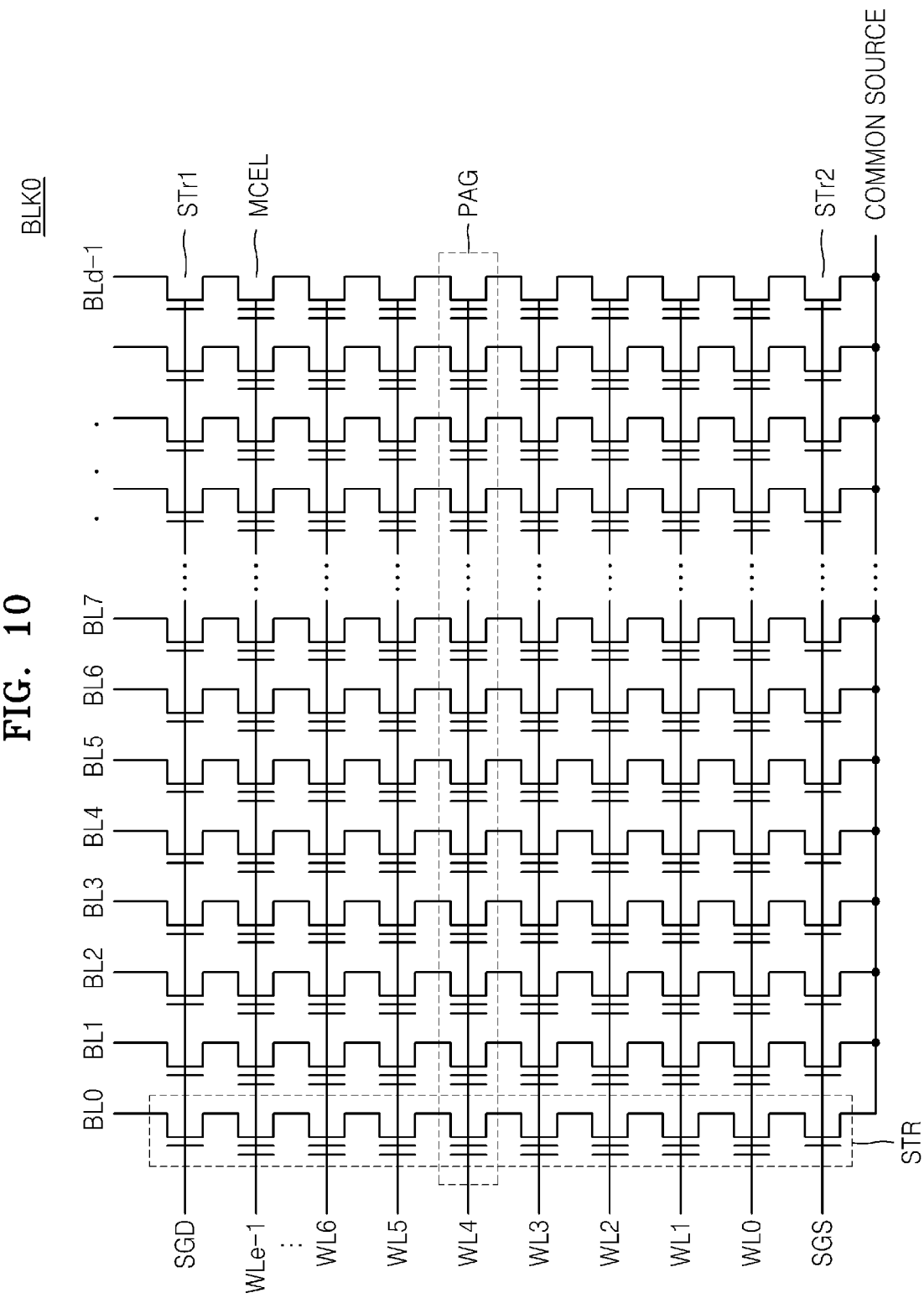
FIG. 10 is a circuit diagram illustrating an example of a block shown in FIG. 9.

FIG. 10 is a circuit diagram illustrating an example of the block BLK0 shown in FIG. 9.

Referring to FIGS. 9 and 10, when the flash memory MEM of FIG. 9 is NAND Flash Memory, for example, each of the blocks BLK0~BLKa-1 may include d (d is an integer greater than or equal to 2) strings STR, where e (e is an integer greater than or equal to 2) memory cells MCEL are connected in series in the direction of bit lines BL0~BLd-1. Each string STR includes a drain select transistor Str1 and a source select transistor Str2, which are respectively connected to both ends of the memory cells MCEL connected in series.

The flash memory MEM according to an embodiment of the inventive concept performs an erase operation by block unit, and performs a program operation by page unit corresponding to each of word lines WL0 to WLe-1. The flash memory MEM may include multiple memory cell arrays performing the same operation and having the same structure as the memory cell array MA described above.

Figure 11:
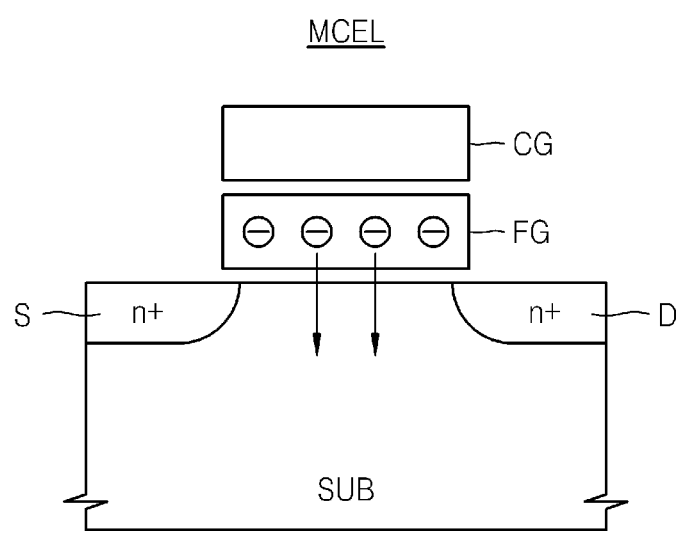
FIG. 11 is a cross-sectional view illustrating an example of a memory cell MCEL shown in FIG. 10.

FIG. 11 is a cross-sectional view illustrating an example of a memory cell MCEL shown in FIG. 10.

Each memory cell MCEL of FIG. 10 may be implemented as shown in FIG. 11, for example. Referring to FIG. 11, a source S and a drain D are formed in a substrate SUB, and a channel region is formed between the source S and the drain D. A floating gate FG is formed on the channel region, and an insulating layer, such as a tunnelling insulating layer, is formed between the channel region and the floating gate FG. A control gate CG is formed on the floating gate FG, and an insulating layer, such as a blocking insulating layer, is formed between the floating gate FG and the control gate CG. Voltages necessary for program, erase, and read operations of the memory cell MCEL may be applied to the substrate SUB, the source S, and the drain D, and the control gate CG.

In the flash memory of FIG. 10, data stored in the memory cell MCEL may be read out using the distinction of a threshold voltage Vth of the memory cell MCEL of FIG. 11. The threshold voltage Vth of the memory cell MCEL may be determined according to the amount of electrons stored in the floating gate FG. For example, as the number of electrons stored in the floating gate FG increases, the threshold voltage Vth of the memory cell MCEL becomes higher.

One bit, two bits, or at least three bits of data may be set within a predetermined range of the threshold voltage Vth of the memory cell MCEL. In correspondence thereto, at least one page may be set for each word line of FIG. 10. That is, at least one page may be programmed for each word line of FIG. 10.

Figure 12A:
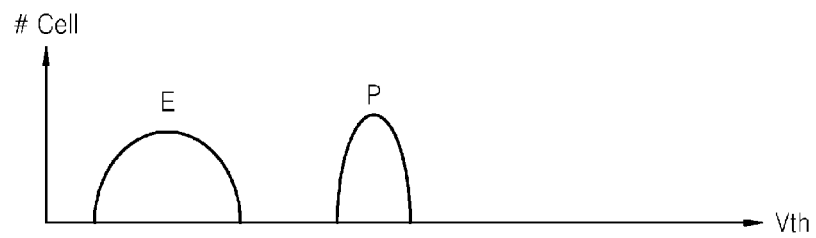
FIGS. 12A, 12B and 12C are views illustrating the distribution of threshold voltages according to a program state set for the memory cell array of FIG. 9.
Figure 12B:
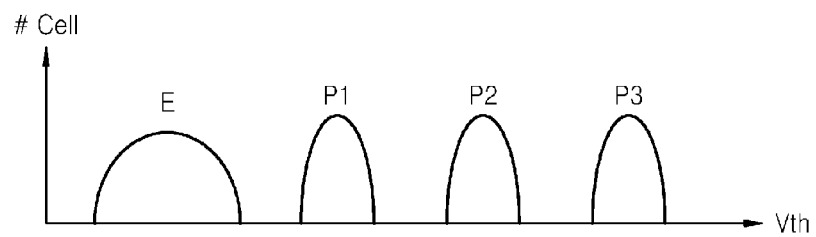
Figure 12C:
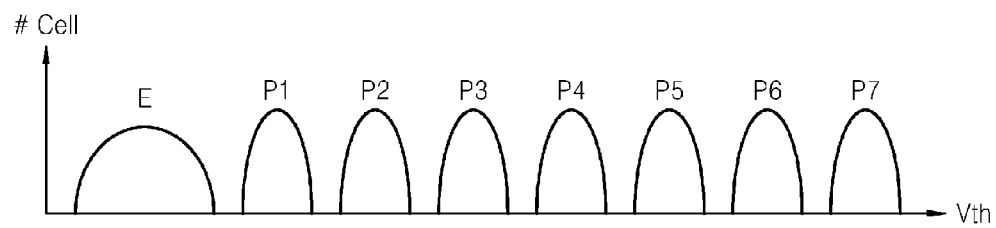

FIGS. 12A to 12C are views illustrating distributions of threshold voltages according to program states set for the memory cell array MCA of FIG. 9.

Referring to FIG. 12A, a memory system MSYS according to an embodiment of the inventive concept may include a NAND flash memory MEM where one bit data is set for a range of each threshold voltage, i.e., each threshold voltage distribution. A NAND flash memory having such a structure is called a Single-Level Cell (SLC) NAND flash memory. Each memory cell MCEL of the SLC NAND flash memory may be programmed with one bit data. In the case of the SLC NAND flash memory, one page may be set for each word line of FIG. 10.

Additionally, the memory system MSYS according to an embodiment of the inventive concept may include a NAND flash memory MEM where at least two-bit data is set for a range of each threshold voltage, as shown in FIG. 12B or FIG. 12C, i.e., each threshold voltage distribution. A NAND flash memory having such a structure is called a Multi-Level Cell (MLC) NAND flash memory. Each memory cell MCEL of the MLC NAND flash memory may be programmed with at least two-bit data. In the case of the MLC NAND flash memory, at least two pages may be set for each word line of FIG. 10.

In the case of a NAND flash memory where three-bit data is programmed into a memory cell, this is called a Triple Level Cell (TLC) NAND flash memory. However, for convenience of description, a NAND flash memory where at least two-bit data is programmed into a memory cell is collectively referred to as MLC NAND flash memory. In the MLC NAND flash memory, in order to identify at least four threshold voltage distributions, the normal read voltage NRV of FIG. 2 may be set with at least three voltage levels.

The memory system MSYS according to an embodiment of the inventive concept may include an SLC NAND flash memory or an MLC NAND flash memory MEM, as mentioned above. However, embodiments of the inventive concept are not limited thereto. The memory system MSYS may include an SLC NAND flash memory and an MLC NAND flash memory simultaneously. In addition, the flash memory MEM may program data into some of the blocks BLK0 to BLKa-1 of FIG. 9 using an SLC method and may program data into other blocks through an MLC method.

In the flash memory according to the above-mentioned embodiments, diverse performance degradation may occur according to inherent structural limitations and surrounding environmental changes. For example, because of noise in a common source line COMMON SOURCE of FIG. 10, changes may occur with respect to endurance according to the repetition of program and erase operations (P/E cycles), retention of electrons trapped in the floating gate FG of FIG. 11, a read disturb phenomenon, and temperature. Also, one or more of the threshold voltage distributions set as shown in FIGS. 12A to 12C may change, as shown in FIGS. 13A and 13B, for example.

Figure 13A:
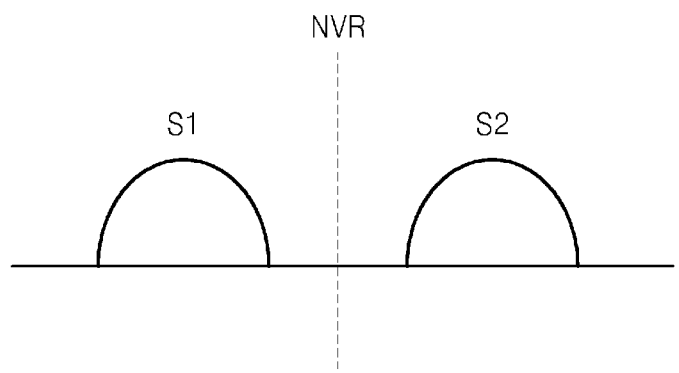
FIGS. 13A and 13B are views illustrating when a threshold voltage distribution of a flash memory is changed, according to an embodiment of the inventive concept.
Figure 13B:
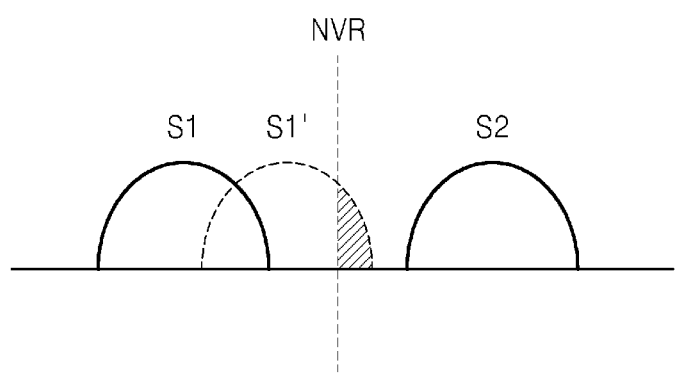

Referring to FIGS. 13A and 13B, two threshold voltage distributions S1 and S2 shown in FIG. 13A, which are identified by the normal read voltage NRV of FIG. 2 set with a voltage level between the two threshold distributions S1 and S2, may be changed as shown in FIG. 13B due to performance degradation of the above-mentioned flash memory MEM. FIG. 13B shows the first threshold voltage distribution S1 moved to the first threshold voltage distribution S1'. In FIG. 13B, when the normal read voltage NRV is used for readout, data different from programmed data may be read out in the shaded portion of the first threshold voltage distribution S1', i.e., an error occurs.

Such an error may be corrected by an Error Check and Correction (ECC) engine, described below. For example, the ECC engine encodes data to be written to generate parity data, and decodes read data and parity data therein to detect and correct errors. However, errors may not be corrected by the ECC engine. In this case, the memory system MSYS may apply various error connection schemes such as read retry and soft decision, in order to correct errors.

Figure 14:
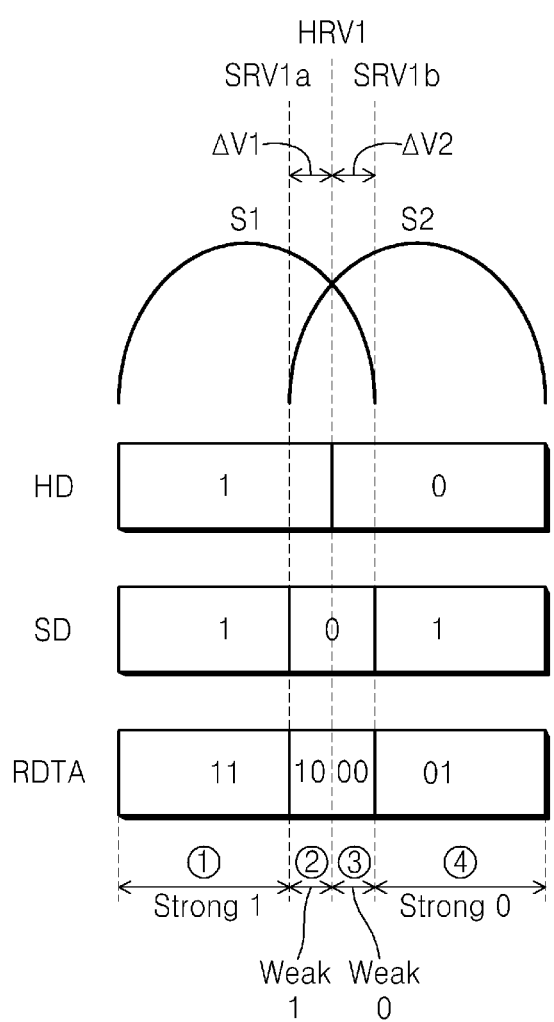
FIG. 14 is a view illustrating a soft decision operation for error correction, according to an embodiment of the inventive concept.

FIG. 14 is a view illustrating a soft decision operation for error correction, according to an embodiment of the inventive concept.

Referring to FIGS. 2 and 14, the soft decision operation applies the first hard read voltage HRV1 to the first address Addr1 of nonvolatile memory cells in order to identify in which range (e.g., the first threshold voltage distribution S1 or the second threshold voltage distribution S2) a threshold voltage of each memory cell is included. A memory cell having a threshold voltage lower than the first hard read voltage HRV1 is identified as 1, and a memory cell having a threshold voltage higher than the first hard read voltage HRV1 is identified as 0.

The first hard read voltage HRV1 may have the same voltage level as the normal read voltage NRV in order to identify the first threshold voltage distribution S1 and the second threshold voltage distribution S2 in response to the normal read command RCMD_N. As mentioned above, in relation to the MLC NAND flash memory having at least four threshold voltage distributions, the normal read voltage NRV may have multiple voltage levels. In this case, the first hard read voltage HRV1 has a voltage level among these voltage levels in order to identify the first threshold voltage distribution S1 and the second threshold voltage distribution S2. The data identified by the first hard read voltage HRV1 may be referred to as hard data HDTA.

Then, the soft decision operation senses soft data SDTA by sequentially applying to the first address Addr1 the first soft read voltage SRV1$a$ and the second soft read voltage SRV1$b$ in one pair having differences of the first voltage value $\Delta$V1 and the second voltage value $\Delta$V2 from the first hard read voltage HRV1, respectively. A memory cell having a threshold voltage lower than the first soft read voltage SRV1$a$ is identified as 1, and a memory cell having a threshold voltage higher than the first soft read voltage SRV1$a$ and lower than the second soft read voltage SRV1$b$ is identified as 0. Also, a memory cell having a threshold voltage higher than the second soft read voltage SRV1$b$ is identified as 1. The soft data SDTA may be formed, for example, using an exclusive OR operation of the inverted values of a bit value due to on-off of a memory cell according to the first soft read voltage SRV1$a$ and a bit value due to on-off of a memory cell according to the second soft read voltage SRV1$b$.

In the example shown in FIG. 14, the reliable data RDTA based on the hard data HDTA and the soft data SDTA may be 11, 10, 00, and 01 with respect to sections ①, ②, ③, and ④, respectively. However, the inventive concept is not limited thereto. That is, the reliable data RDTA based on the hard data HDTA and the soft data SDTA may be set to other values.

Accordingly, the memory system MSYS processes data (bit) read from a memory cell having a threshold voltage in section ①, where the reliable data RDTA is identified as 11, as "strong 1" (indicating that a corresponding data (bit) value is identified as 1 and it is likely to be 1). That is, the memory system MSYS may assign a weight of strong 1 to data (bit) which is read from a memory cell having a threshold voltage in section ① where the reliable data RDTA is identified as 11. The memory system MSYS processes data (bit), read from a memory cell having a threshold voltage in the section ②, where the reliable data RDTA is identified as 10, as "weak 1" (indicating that a corresponding data (bit) value is identified as 1 but is less likely to be 1). That is, the memory system MSYS may assign a weight of weak 1 to data (bit) which is read from a memory cell having a threshold voltage in section ② where the reliable data RDTA is identified as 10.

In the same manner, the memory system MSYS may assign a weight of "strong 0" (indicating that a corresponding data (bit) value is identified as 0 and is likely to be 0) to data (bit) read from a memory cell having a threshold voltage in section ③, where the reliable data RDTA is identified as 00, and then may process the data. The memory system MSYS may assign a weight of "weak 0" (indicating that a corresponding data (bit) value is identified as 0 but is less likely to be 0) to data (bit) read from a memory cell having a threshold voltage in the section ④, where the reliable data RDTA is identified as 01, and then may process the data.

The weight obtained by performing such a soft decision may be a criterion of error correction, described below. Accordingly, in order to perform an accurate error correction operation, the reliable data RDTA, i.e., weights assigned by identifying each threshold voltage of a memory cell using a soft decision operation, needs to be accurate. For this, a soft decision operation according to an embodiment of the inventive concept is performed.

FIG. 15 is a view illustrating a soft decision operation, according to an embodiment of the inventive concept.

Referring to FIGS. 2 and 15, the memory system MSYS may be configured to set the first voltage value $\Delta$V1 and the second voltage value $\Delta$V2, where the difference between the first voltage value $\Delta$V1 and the second voltage value $\Delta$V2 corresponds to the difference (wd2−wd1) between the voltage ranges of adjacent first and second threshold voltage distributions S1 and S2. For example, in the memory system MSYS, among the adjacent first and second threshold voltage distributions S1 and S2, the second voltage value $\Delta$V2 corresponds to the threshold voltage distribution 51 having the wide voltage range wd1, and the first voltage value $\Delta$V1 corresponds to the threshold voltage distribution S2 having the narrow voltage range wd2. Since the wide voltage range wd1 is greater than the narrow voltage range wd2, the second voltage value $\Delta$V2 is greater than the first voltage value $\Delta$V1.

Figures 16, 17:
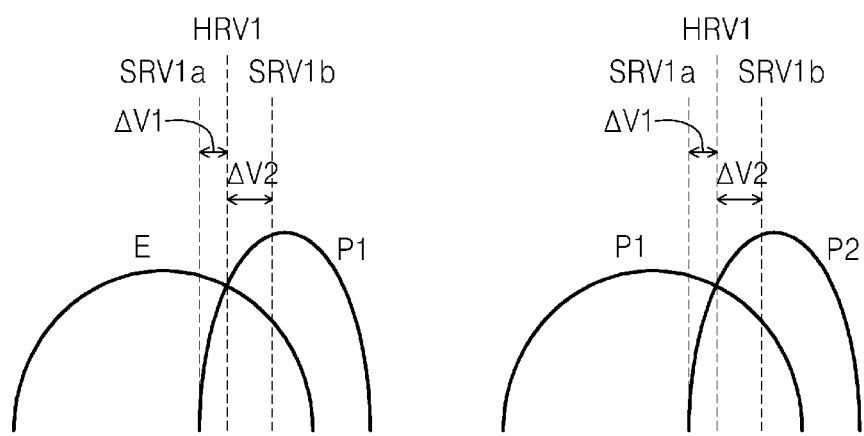
FIGS. 16 and 17 are views illustrating a threshold voltage distribution when the soft decision operation of FIG. 15 is performed, according to an embodiment of the inventive concept.

At this point, the adjacent first and second threshold voltage distributions S1 and S2 having the differently set second voltage value $\Delta$V2 and first voltage value $\Delta$V1, respectively, as shown in the example of FIG. 16, may be threshold voltage distributions for an erase state E and a first program state P1 adjacent to the erase state E. In relation to the erase state E, as shown in FIGS. 12A-12C, the threshold voltage distribution may be set with a different range than the program state.

Or, the adjacent first and second threshold voltage distributions S1 and S2 having the differently set second voltage value $\Delta$V2 and first voltage value $\Delta$V1, respectively, as shown in the example of FIGS. 12A-12C, may be threshold voltage distributions for adjacent program states among program states (P1 to P3 of FIG. 12B or P1 to P7 of FIG. 12C) of FIG. 12B or 12C. For example, the adjacent first and second threshold voltage distributions S1 and S2 having the differently set second voltage value $\Delta$V2 and first voltage value $\Delta$V1, respectively, as shown in FIG. 17, may be threshold voltage distributions for the first program state P1 and the second program state P2. Each program state having a threshold voltage distribution set in the same range may have a different threshold voltage distribution set in a different range, due to a change in distribution.

However, when soft decision is performed on a threshold voltage distribution having a different voltage range using soft data having the same voltage differences as hard read voltage, the characteristics of a threshold voltage distribution and another weight may be set. For example, if the first voltage value $\Delta$V1 and second voltage value $\Delta$V2 are set as shown in FIG. 15, a threshold voltage corresponding to the first threshold voltage distribution S1 may be greater than the second soft read voltage SRV1$b$. However, an error may occur by identifying a value stored in a corresponding memory cell as strong 0. The error may be prevented, though, by setting a soft read voltage with a voltage difference adaptable to each threshold voltage using a memory system and a method of operating the same, according to embodiments of the inventive concept. Hereinafter, in relation to the memory system and the method of operating the same, a method of detecting and setting a width difference or change between the first voltage value $\Delta$V1 and the second voltage value $\Delta$V2 will be described.

Again, referring to FIGS. 2 and 5, as mentioned above, the method may include setting a difference between the first voltage value ΔV1 and the second voltage value ΔV2. For example, as shown in FIG. 18, the memory system MSYS may read an arbitrary page (nonvolatile memory cells) using a voltage Vr having a voltage level included in a threshold voltage distribution corresponding to the erase state E among the threshold voltage distributions, and count the number of same bit values in order to set the first voltage value ΔV1 and the second voltage value ΔV2. Likewise, the memory system MSYS may read an arbitrary page (nonvolatile memory cells) using a voltage Vh having a voltage level included in a threshold voltage distribution corresponding to an arbitrary program state (for example, a Pn distribution of FIG. 18 having the highest voltage level) among the threshold voltage distributions, and count the number of same bit values in order to set the first voltage value ΔV1 and the second voltage value ΔV2a. For example, the memory system MSYS may count the number of 1s included in an arbitrary page (nonvolatile memory cells) read using the voltage Vr. If the number of 1s is large, it is determined that the voltage range of the threshold voltage distribution corresponding to the erase state E extends in a direction of a high voltage level.

The memory system MSYS according to an embodiment of the inventive concept may include a counter (not shown) for counting the number of bits having the same bit value from the read page (nonvolatile memory cells).

In contrast, the memory system MSYS may set the first voltage value ΔV1 and the second voltage value ΔV2 based on endurance information therein. As mentioned above, a threshold voltage distribution may vary depending on changes in program/erase (P/E) cycles. Also, asymmetry between adjacent threshold voltage distributions may occur according to changes in threshold voltage distribution. Referring to FIG. 19, the memory system MSYS may include a table for storing the first voltage value ΔV1 and the second voltage value ΔV2 set according to endurance information (e.g., P/E cycle), and may set the first voltage value ΔV1 and the second voltage value ΔV2 accordingly. For example, when the P/E cycle is less than 1K, based on the table of FIG. 19, the first voltage value ΔV1 and the second voltage value ΔV2 are set to a first value VAL1 and a second value VAL2, respectively. When the P/E cycle is more than 1K and less than 2K, based on the table of FIG. 19, the first voltage value ΔV1 and the second voltage value ΔV2 are set to a third value VAL3 and a fourth value VAL4, respectively.

The table of FIG. 19 may be stored in and/or managed by the firmware of FIG. 8. Moreover, the memory system MSYS may include a counter (not shown) for counting the P/E cycles.

Setting the difference between the first voltage value ΔV1 and the second voltage value ΔV2 of FIG. 5 may be performed when the memory system MSYS is turned on or when error is indicated as a result of reading nonvolatile memory cells. Also, as mentioned above, setting the difference between the first voltage value ΔV1 and the second voltage value ΔV2 may be performed by the memory controller MCtrl. Moreover, setting the difference between the first voltage value ΔV1 and the second voltage value ΔV2 may be performed by the on-chip controller OCC in the flash memory MEM.

Figure 20:
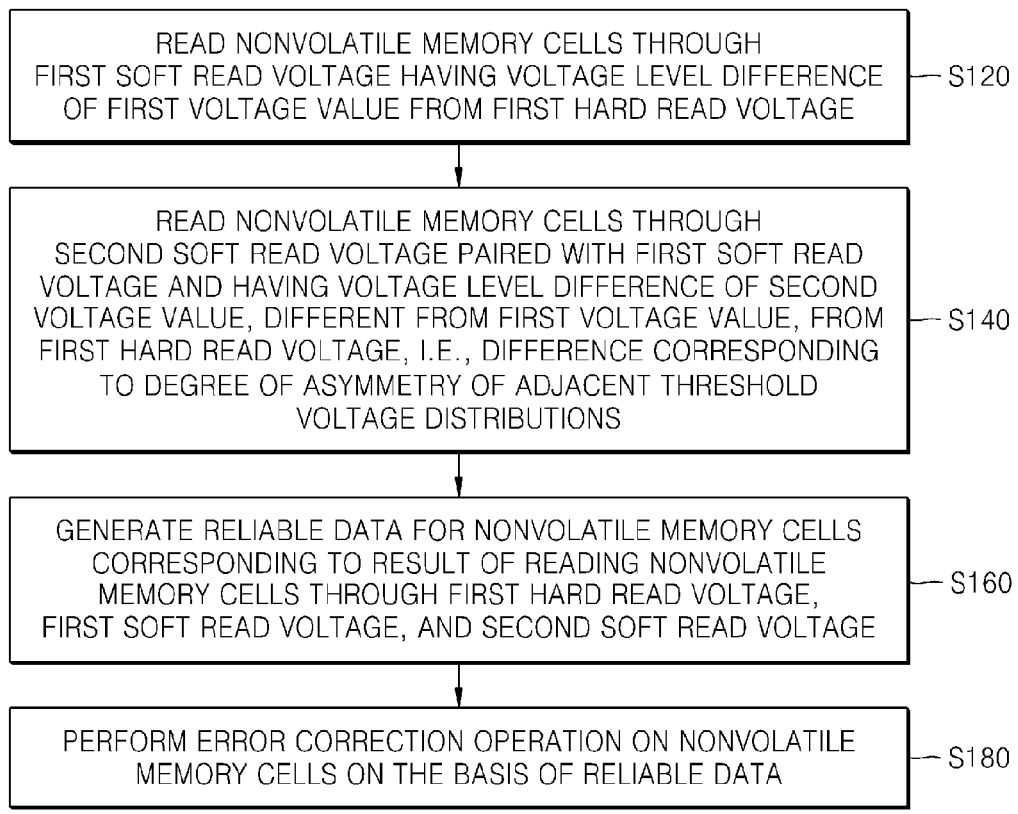
FIG. 20 is a flowchart illustrating a method of operating a memory system, according to another embodiment of the inventive concept.

FIG. 20 is a flowchart illustrating a method of operating a memory system, according to another embodiment of the inventive concept.

Figure 21:
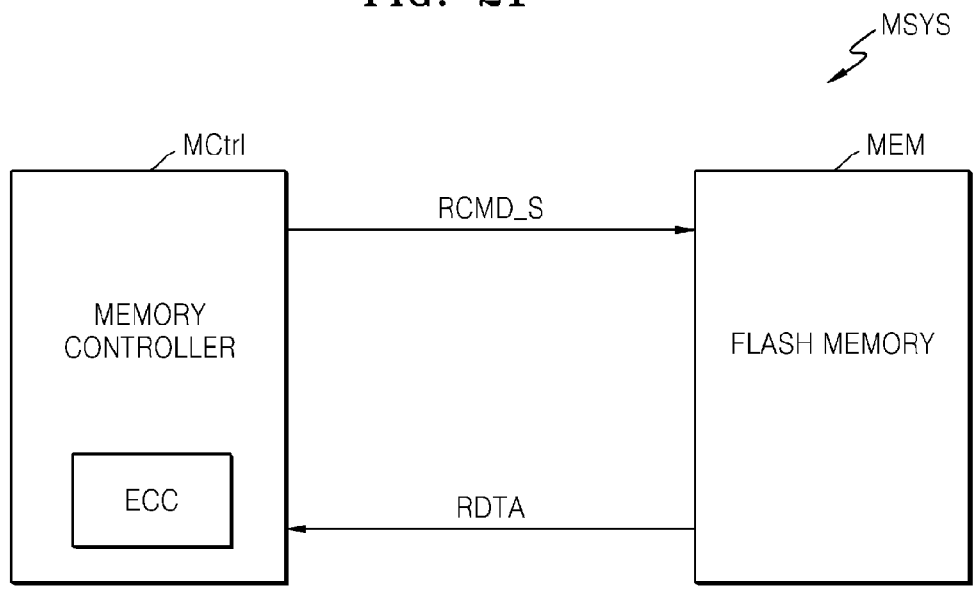
FIG. 21 is a block diagram of a memory system operating according to the method of FIG. 20 according to an embodiment of the inventive concept.

Referring to FIGS. 2 and 20, after nonvolatile memory cells are read out using the operating method of FIG. 1, the method of operating a memory system, according to another embodiment of the inventive concept further includes generating the reliable data RDTA for nonvolatile memory cells in operation S160, the reliable data corresponding to a result of reading the nonvolatile memory cells using the first hard read voltage HRV1, the first soft read voltage SRV1a, and the second soft read voltage SRV1b, and performing an error correction operation on the nonvolatile memory cells in operation S180 on the basis of the reliable data RDTA. Since an example of the reliable data RDTA is described with reference to FIG. 14, the description thereof will not be repeated. In addition, an error correction operation according to an embodiment of the inventive concept, as mentioned above, may be performed by an ECC engine on the basis of the reliable data RDTA, and the ECC engine, as shown in FIG. 21, may be included in the memory controller MCtrl, for example.

In an embodiment, the ECC engine receives the reliable data RDTA and executes an algorithm using a weight in the reliable data RDTA, so that it may correct an error in the read nonvolatile memory cells. For example, the ECC engine may determine which of 0 and 1 is more appropriate for a corresponding bit using a Log-Likelihood Ratio (LLR) algorithm. As mentioned above, since reliable data is generated using a weight that accurately reflects an asymmetric distribution, the decoding time taken for the ECC engine to perform the LLR algorithm several times due to wrong weights may be reduced. Accordingly, error correction is more accurate and operating speed is improved using the memory system and the method of operating the same, according to an embodiment of the inventive concept.

Generally, embodiments including a soft decision operation according to one hard read voltage and one pair of soft read voltages corresponding thereto have been described above. However, the inventive concept is not limited thereto. Using the memory system and the method of operating the same, according to an embodiment of the inventive concept, a soft decision operation may be performed by at least two hard read voltages or at least two pairs of soft read voltages corresponding to each hard read voltage, as described below.

Figure 22:
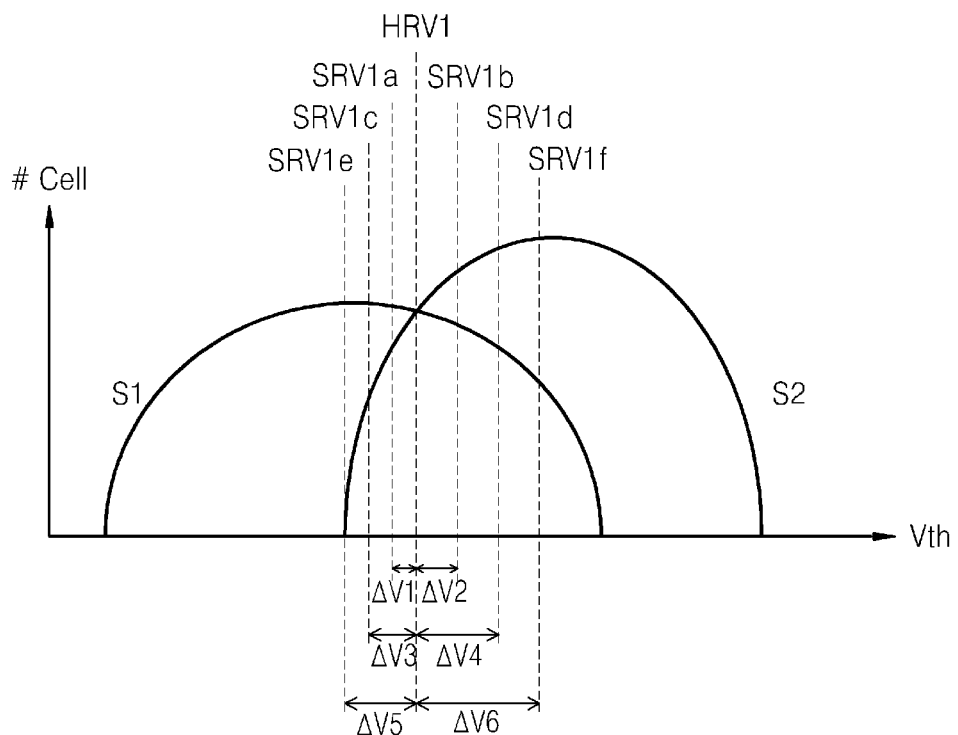
FIG. 22 is a view illustrating a soft decision operation including multiple pairs of soft read voltages, according to an embodiment of the inventive concept.

FIG. 22 is a view illustrating a soft decision operation including multiple pairs of soft read voltages, according to an embodiment of the inventive concept.

Referring to FIG. 22, the memory system MSYS according to an embodiment of the inventive concept may perform a soft decision operation using the first hard read voltage HRV1 and three pairs of soft read voltages SRV1a to SRV1f for the first hard read voltage HRV1. Each soft read voltage pair, namely, the soft read voltage pairs SRV1a and SRV1b, SRV1c and SRV1d, and SRV1e and SRV1f, may be set to different voltage differences ΔV1 and ΔV2, ΔV3 and ΔV4, and ΔV5 and ΔV6, respectively, with respect to the first hard read voltage HRV1. The description of the voltage differences is substantially the same as the description of the first voltage value ΔV1 and the second voltage value ΔV2 for the first soft read voltage SRV1a and the second soft read voltage SRV1b, and therefore will not be repeated. For example, within each soft read voltage pair, the second values ΔV2, ΔV4, ΔV6 may be different from (e.g., greater than) the first voltage values ΔV1, ΔV3, ΔV5, respectively.

Figure 23:
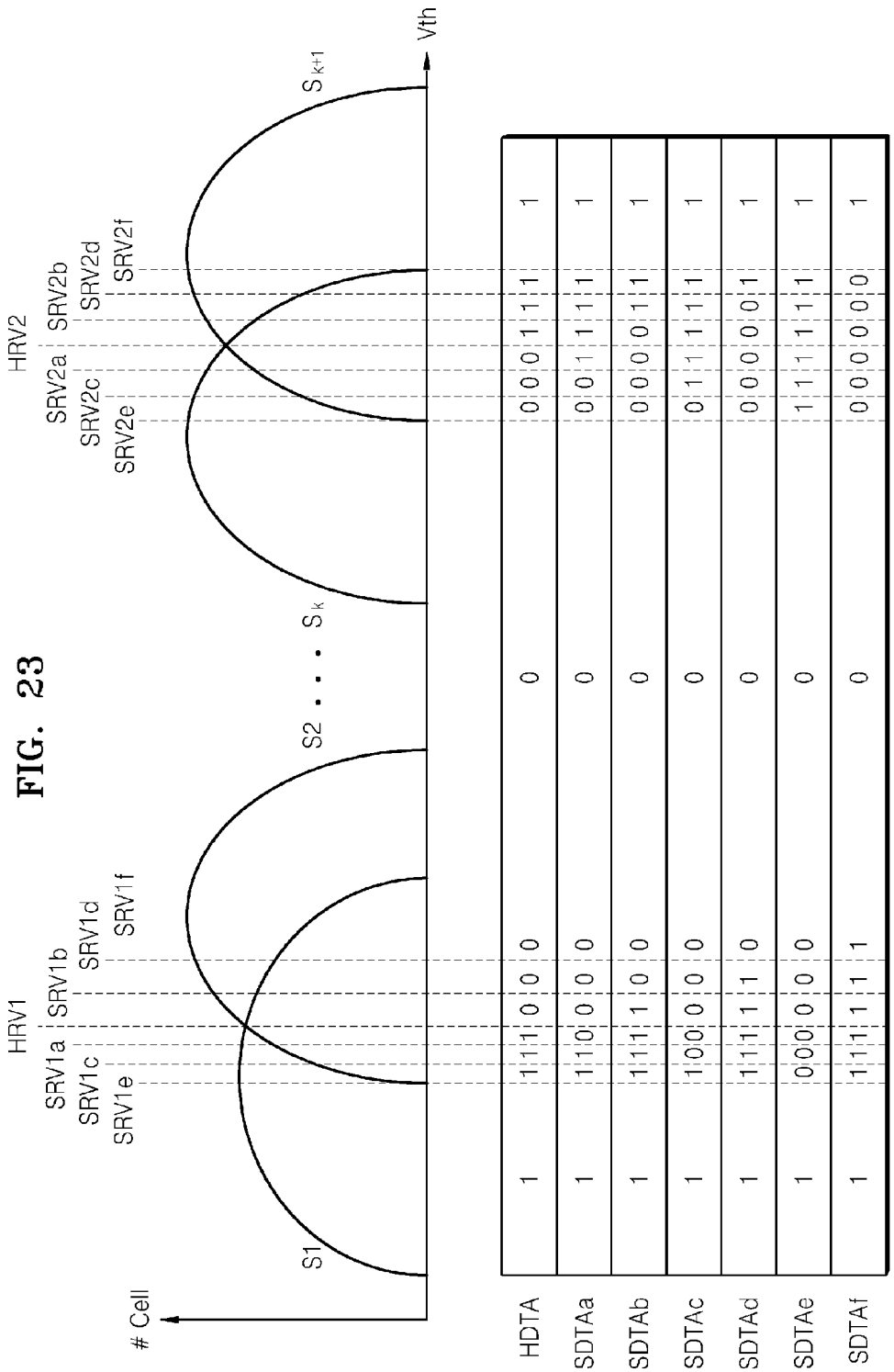
FIG. 23 is a view illustrating a soft decision operation, providing an example of reliable data, according to an embodiment of the inventive concept.

FIG. 23 is a view illustrating a soft decision operation, providing an example of reliable data, according to an embodiment of the inventive concept.

Referring to FIG. 23, a soft decision operation is performed using two hard read voltages HRV1 and HRV2 and three pairs of soft read voltages SRV1a to SRV1f for each of the two hard read voltages HRV1 and HRV2, in order to generate reliable data. For each memory cell, a bit value stored in a memory cell having a threshold voltage lower than the first hard read voltage HRV1 is identified as 1, a bit value stored in a memory cell having a threshold voltage higher than the first hard read voltage HRV1 and lower than the second hard read voltage HRV2 is identified as 0, and a bit value stored in a memory cell having a threshold voltage higher than the second hard read voltage HRV2 is identified as 1. These values are read out as hard data HDTA.

For each memory cell, a bit value stored in a memory cell having a threshold voltage lower than the first soft read voltage SRV1$a$ is identified as 1, a bit value stored in a memory cell having a threshold voltage higher than the first soft read voltage SRV1$a$ and lower than the second soft read voltage SRV2$a$ is identified as 0, and a bit value stored in a memory cell having a threshold voltage higher than the second soft read voltage SRV2$a$ is identified as 1. These values are read out as soft data SDTAa. Using this same determination scheme, second soft data SDTAb to sixth soft data SDTAf may be read out, the results of which are shown in FIG. 23.

Reliable data for each section divided by each hard read voltage and soft read voltage may be formed by bit values at the same positions of the hard data HDTA and first to sixth soft data SDTAa to SDTAf for a corresponding section. For example, reliable data for a section having the lowest voltage level may be formed with 1111111, and reliable data for a section having the second lowest voltage level may be formed with 1111101. Generally, as the number of is greater, the reliable data of the corresponding sections becomes more weighted to storing 1 (where 1111111 indicates most likely storing 1), and as the number of 0s is greater, the reliable data of the corresponding sections becomes more weighted to storing 0 (where 0000000 indicates most likely storing 0).

As shown in FIG. 23, the forms of the adjacent threshold voltage distributions S1 and S2 to which the first hard read voltage HRV1 is applied are different (asymmetric), and the forms of the adjacent threshold voltage distributions Sk and Sk+1 to which the second hard read voltage HRV2 is applied are identical (symmetric). However, embodiments of the inventive concept are not limited to this example. That is, the forms of adjacent threshold voltage distributions to which different hard read voltages are applied may be all identical, all different, or partially different. Additionally, although the soft decision is performed using three pairs of soft read voltages for two hard read voltages, embodiments of the inventive concept are not limited to this example. That is, soft decisions may be performed using a different number of hard read voltages and/or soft read voltages for each hard read voltage.

Figure 24:
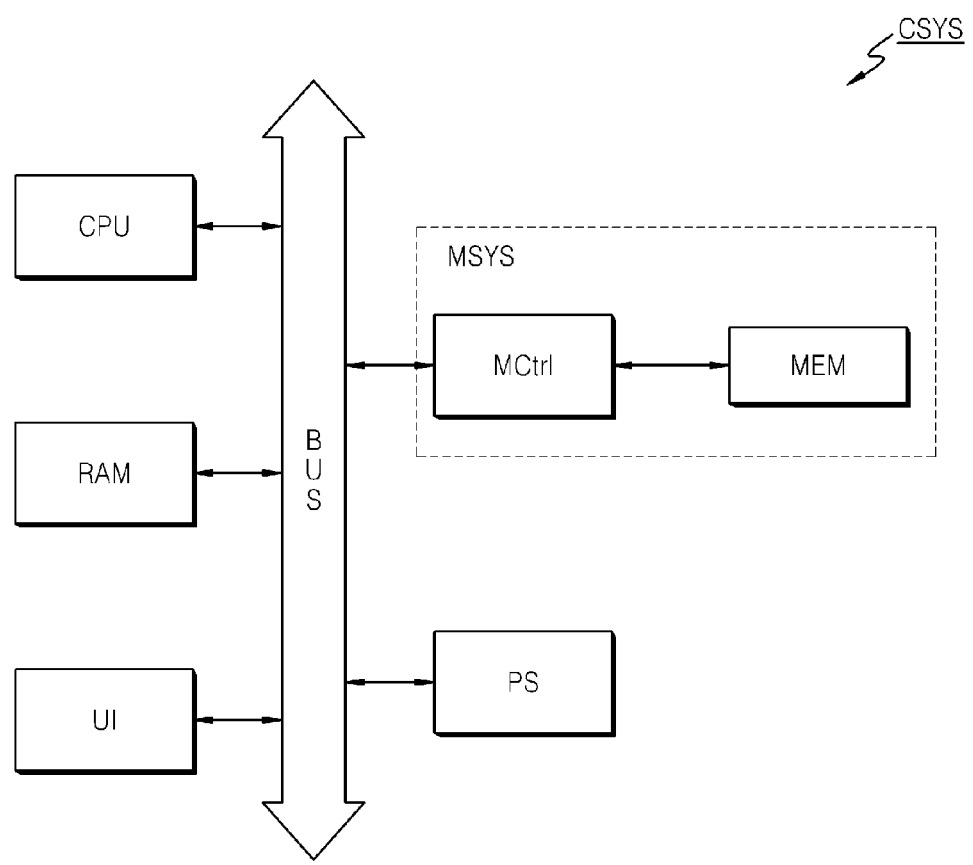
FIG. 24 is a block diagram illustrating a computer system, according to an embodiment of the inventive concept.

FIG. 24 is a block diagram illustrating a computer system CSYS, according to an embodiment of the inventive concept.

Referring to FIG. 24, the computer system CSYS includes a processor CPU, a user interface UI, and a memory system MSYS, which are electrically connected to a bus BUS. The memory system MSYS may be the memory system MSYS of FIG. 2, for example, according to an embodiment of the inventive concept, including a memory controller MCtrl and a flash memory MEM. Also, a memory device MDEV in the memory system MSYS may include the flash memory MEM of FIG. 3, for example. Accordingly, reliability and operation speed of a memory device or a memory system is improved using the memory system MSYS.

The computer system CSYS according to an embodiment of the inventive concept further includes a power supply device PS. Additionally, the computer system CSYS further include a volatile memory device (for example, RAM) for data transmission between the processor CPU and the memory system MSYS.

When the computer system CSYS is a mobile system, a battery for supplying an operating voltage to the computer system CSYS and a modem such as a baseband chipset may be additionally provided. Of course, the computer system CSYS according to embodiments of the inventive concept may further include an application chipset, a camera image processor (CIS), mobile DRAM and other such devices, as would be apparent to one of ordinary skill in the art. Thus, descriptions thereof will not be provided.

Figure 25:
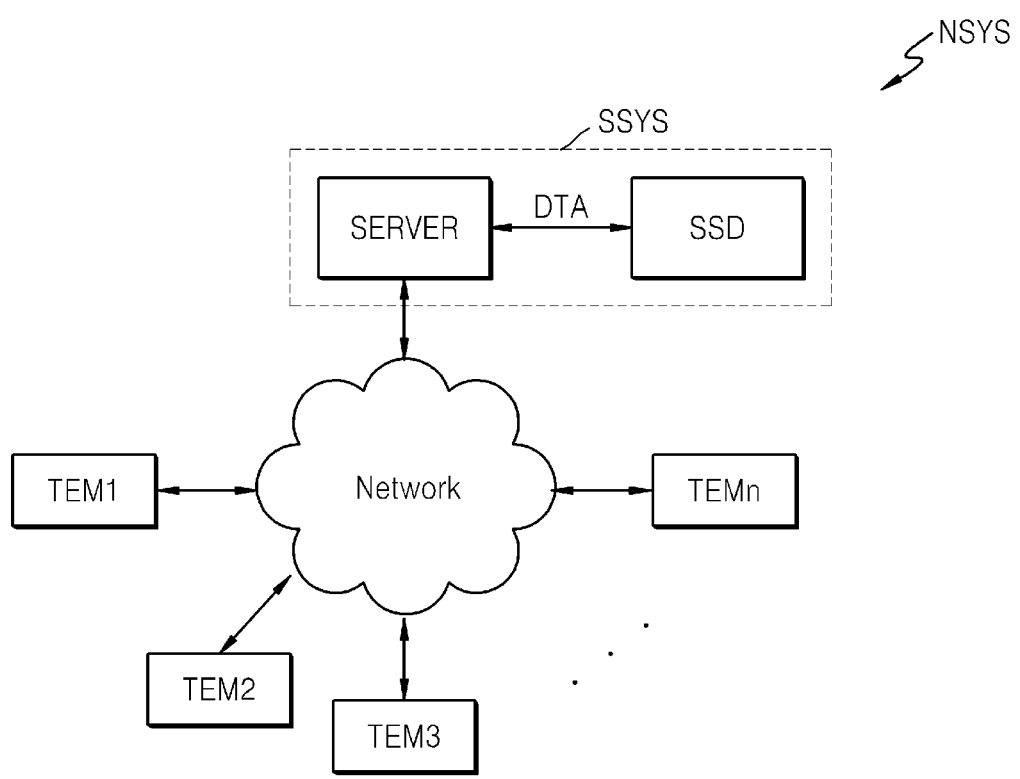
FIG. 25 is a block diagram illustrating a network system including a server system, according to an embodiment of the inventive concept.

FIG. 25 is a block diagram illustrating a network system NSYS including a server system SSYS and a network system NSYS, according to an embodiment of the inventive concept.

Referring to FIG. 25, the network system NSYS include the server system SSYS and multiple terminals TEM1 to TEMn, which are connected via a network. The server system SSYS may include a server configured to process requests received from the terminals TEM1 to TEMn connected to the network and an SSD configured to store data corresponding to requests received from the terminals TEM1 to TEMn. The SSD of FIG. 25 may be the SSD of FIG. 7, fore example, according to an embodiment of the inventive concept. Accordingly, reliability and operation speed a memory device or a memory system is improved using the network system NSYS and the server system SSYS.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method of operating a memory system, the method comprising:
   reading nonvolatile memory cells using a first soft read voltage, a voltage level difference between the first soft read voltage and a first hard read voltage being indicated by a first voltage value; and
   reading the nonvolatile memory cells using a second soft read voltage paired with the first soft read voltage, a voltage level difference between the second soft read voltage and the first hard read voltage being indicated by a second voltage value, the second voltage value being different than the first voltage value,
   wherein a difference between the first voltage value and the second voltage value corresponds to a degree of asymmetry of adjacent threshold voltage distributions among a plurality of threshold voltage distributions set for the nonvolatile memory cells of the memory system.

2. The method of claim 1, wherein the adjacent threshold voltage distributions comprise a threshold voltage distribution corresponding to an erase state and a threshold voltage distribution corresponding to a first program state among the plurality of threshold voltage distributions.

3. The method of claim 1, wherein each of the adjacent threshold voltage distributions comprise a threshold voltage distribution representing a first program state and a threshold voltage distribution representing an nth program state among the plurality of threshold voltage distributions.

4. The method of claim 1, further comprising:
   setting the difference between the first voltage value and the second voltage value.

5. The method of claim 4, wherein setting the difference between the first voltage value and the second voltage value comprises counting the number of at least one arbitrary bit value read using a voltage level included in a threshold voltage distribution corresponding to an erase state or a threshold voltage distribution having the highest voltage level, among the plurality of threshold voltage distributions.

6. The method of claim 4, wherein the difference between the first voltage value and the second voltage value is set based on endurance information of the memory system.

7. The method of claim 6, wherein the endurance information of the memory system comprises a difference between the first voltage value and the second voltage value for each range of a program/erase (P/E) cycle, the endurance information being stored in an arbitrary storage of the memory system as a table.

8. The method of claim 4, wherein the difference between the first voltage value and the second voltage value is set when the memory system is turned on or a result of reading the nonvolatile memory cells includes an error.

9. The method of claim 4, wherein the difference between the first voltage value and the second voltage value is set by a memory controller of the memory system.

10. The method of claim 4, wherein the difference between the first voltage value and the second voltage value is set by an on-chip controller included in a flash memory of the memory system.

11. The method of claim 1, wherein one of the first voltage value and the second voltage value corresponding to a threshold voltage distribution having a wide voltage range is greater than the other one of the voltage value and the second voltage value corresponding to a threshold voltage distribution having a narrow voltage range.

12. The method of claim 1, further comprising:
reading the nonvolatile memory cells using a third soft read voltage, a voltage level difference between the third soft read voltage and the first hard read voltage being indicated by a third voltage value; and
reading the nonvolatile memory cells using a fourth soft read voltage paired with the third soft read voltage, a voltage level difference between the fourth soft read voltage and the first hard read voltage being indicated by a fourth voltage value, the fourth voltage value being different than the third voltage value.

13. The method of claim 1, further comprising:
generating reliable data for the nonvolatile memory cells, the reliable data corresponding to a result of reading the nonvolatile memory cells using the first hard read voltage, the first soft read voltage, and the second soft read voltage.

14. The method of claim 13, further comprising:
performing an error correction operation on the nonvolatile memory cells on the basis of the reliable data.

15. A method of operating a memory system, the method comprising:
applying a plurality of hard read voltages to a word line;
sequentially applying at least one pair of soft read voltages corresponding to each hard read voltage among the plurality of hard read voltages to the word line; and
correcting a readout error of data programmed in nonvolatile memory cells connected to the word line on the basis of reliable data, the reliable data being read from the nonvolatile memory cells using each of the hard read voltages and the corresponding at least one pair of soft read voltages, wherein each pair of the at least one pair of soft read voltages has differently set voltage differences from the corresponding hard read voltage on the basis of a degree of asymmetry of adjacent threshold voltage distributions having different bit values of hard data identified by the corresponding hard read voltage, and
wherein the differences from the corresponding hard read voltage for each pair of the at least one pair of soft read voltages correspond to results of counting the number of arbitrary bit values read using a voltage level in a threshold voltage distribution corresponding to an erase state or a threshold voltage distribution having the highest voltage level.

16. The method of claim 15, further comprising:
reading the nonvolatile memory cells using each of the hard read voltages and a first soft read voltage and a second soft voltage of the corresponding at least one pair of soft read voltages, a voltage level difference between the first soft read voltage and the hard read voltage being indicated by a first voltage value and a voltage level difference between the second soft read voltage and the hard read voltage being indicated by a second voltage value,
wherein the second voltage value is different from the first voltage value.

17. A memory system comprising:
a flash memory comprising a plurality of memory cells arranged in a plurality of word lines; and
a memory controller for controlling a read operation of the flash memory, the memory controller being configured to provide a normal read command to the flash memory to read normal read data from the plurality of non-volatile memory cells, and to provide a soft decision command to the flash memory when an error is detected in the normal read data,
wherein the flash memory is configured to apply a first hard read voltage, a first soft read voltage, and a second soft read voltage paired with the first soft read voltage to a selected word line in response to the soft decision command to read corresponding memory cells, wherein a voltage level difference between the first soft read voltage and the first hard read voltage is indicated by a first voltage value and a voltage level difference between the second soft read voltage and the first hard read voltage is indicated by a second voltage value, the second voltage value being different from the first voltage value.

18. The memory system of claim 17, wherein the difference between the second voltage value and the first voltage value corresponds to an asymmetry between adjacent threshold voltage distributions among multiple threshold voltage distributions set for the memory system.

19. The memory system of claim 18, wherein the flash memory is further configured to generate reliable data corresponding to a result of reading the memory cells using the first hard read voltage, the first soft read voltage, and the second soft read voltage.

20. The memory system of claim 19, wherein the memory controller comprises an Error Check and Correction (ECC) engine configured to perform an error correction operation on the memory cells based on the reliable data.

* * * * *